United States Patent [19]

Takayama et al.

[11] Patent Number: 5,402,005
[45] Date of Patent: Mar. 28, 1995

[54] SEMICONDUCTOR DEVICE HAVING A MULTILAYERED WIRING STRUCTURE

[75] Inventors: Kohichi Takayama, Hino; Masanori Kinugasa, Kawasaki; Munenobu Kida, Tokyo; Shuichi Shoji, Ooita, all of Japan

[73] Assignee: Kabushiki Kaisha Toshiba, Kawasaki, Japan

[21] Appl. No.: 291,037

[22] Filed: Aug. 15, 1994

Related U.S. Application Data

[63] Continuation of Ser. No. 2,128, Jan. 8, 1993, abandoned, which is a continuation of Ser. No. 744,687, Aug. 9, 1991, abandoned, which is a continuation of Ser. No. 467,241, Jan. 19, 1990, abandoned.

[30] Foreign Application Priority Data

Jan. 20, 1989 [JP] Japan ..................... 1-9843

[51] Int. Cl.⁶ .............. H01L 23/48; H01L 29/46; H01L 29/54; H01L 29/62
[52] U.S. Cl. .................... 257/758; 257/211; 257/508; 257/633
[58] Field of Search .............. 357/71, 68; 257/758, 257/207, 211, 489, 508, 633

[56] References Cited

U.S. PATENT DOCUMENTS

| | | | |
|---|---|---|---|
| 3,890,636 | 6/1975 | Harada et al. | 357/68 |
| 4,500,906 | 2/1985 | Ohno et al. | 357/71 |
| 4,604,641 | 9/1986 | Konishi | 357/59 |
| 4,832,789 | 5/1989 | Okhran et al. | 156/644 |
| 4,877,483 | 10/1989 | Bergemont et al. | 156/653 |
| 4,907,066 | 3/1990 | Thomas et al. | 357/71 |
| 4,910,579 | 3/1990 | Bowman et al. | 357/71 |
| 4,970,572 | 11/1990 | Kato et al. | 257/758 |
| 5,075,753 | 12/1991 | Kozono | 257/758 |
| 5,229,642 | 7/1993 | Hara et al. | 257/207 |

FOREIGN PATENT DOCUMENTS

| | | | |
|---|---|---|---|
| 0130591 | 1/1985 | European Pat. Off. | 357/68 |
| 0125847 | 7/1983 | Japan | 357/68 |
| 0059774 | 4/1985 | Japan | 357/68 |
| 0225837 | 10/1986 | Japan | 357/68 |
| 61-234052 | 10/1986 | Japan | 257/758 |
| 61-288439 | 12/1986 | Japan . | |
| 62-202525 | 9/1987 | Japan . | |
| 0258065 | 10/1988 | Japan | 357/68 |

OTHER PUBLICATIONS

Patent Abstracts of Japan, vol. 10, No. 164 (E-410)[2220], Jun. 11, 1986 & JP-A-61 015 350 (Nippon Gakki Seizo K.K.) Jan. 23, 1986.
Patent Abstracts of Japan, vol. 11, No. 152 (E-507), May 16, 1987 & JP-A-61 288 439 (Fujitsu Ltd.) Dec. 18, 1986.
Patent Abstracts of Japan, vol. 12, No. 060 (E-584), Feb. 23, 1988 & JP-A-62 202 525 (Hitachi Ltd.) Sep. 7, 1987.
Patent Abstracts of Japan, vol. 14, No. 41 (E-879), Jan. 25, 1990 & JP-A-01 274 456 (Nec Corp.) Nov. 11, 1989.

*Primary Examiner*—Sara W. Crane
*Attorney, Agent, or Firm*—Finnegan, Henderson Farabow, Garrett & Dunner

[57] ABSTRACT

At least one slit having a predetermined shape is formed around a contact region of a lower wiring layer formed on a substrate, and an insulating portion formed integrally with an insulating layer is embedded in this slit. This insulating layer is formed on the lower wiring layer and has a contact hole located at a position corresponding to the contact region. Since the insulating portion as a rectangular projecting portion projects into the slit downwardly from the rigid insulating layer, positional errors caused by thermal expansion of the lower wiring layer in annealing of the upper wiring layer can be suppressed, and an abnormal geometry such as a projection on the upper wiring layer can be prevented. In addition, a semiconductor device free from interwiring short-circuiting and excellent in flatness can be obtained.

26 Claims, 4 Drawing Sheets

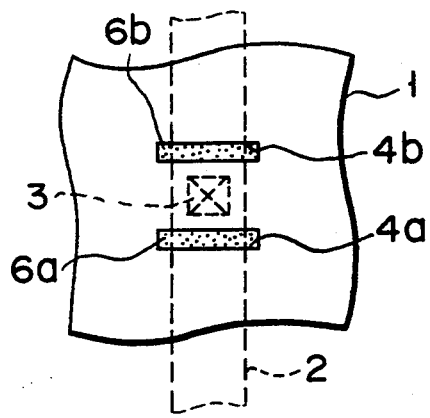
F I G. 3
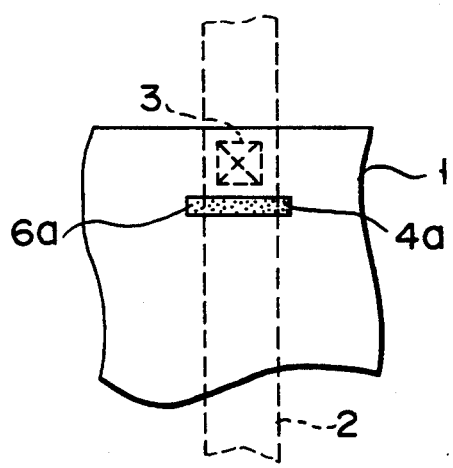
F I G. 4

SEMICONDUCTOR DEVICE HAVING A MULTILAYERED WIRING STRUCTURE

This application is a continuation of application Ser. No. 08/002,128, filed Jan. 8, 1993, now abandoned, which is a continuation of application Ser. No. 07/744,687, filed Aug. 9, 1991, now abandoned, which is a continuation of application Ser. No. 07/467,241, filed Jan. 19, 1990, now abandoned.

BACKGROUND OF THE INVENTION

1. Field of the Invention

The present invention relates to a semiconductor device and, more particularly, to a semiconductor device having a multilayered wiring structure.

2. Description of the Related Art

A semiconductor device manufactured by conventional techniques will be described with reference to FIG. 1. FIG. 1 is a sectional view showing the semiconductor device manufactured by conventional techniques.

The semiconductor device having a multilayered wiring structure formed by conventional techniques comprises an insulating layer 26 formed on a semiconductor substrate 21, a lower wiring layer 22 formed on the insulating layer 26, an insulating layer 23 formed on the lower wiring layer 22 and having a contact hole 25 in a predetermined contact region, and an upper wiring layer 24 formed on the insulating layer 23 and connected to the lower wiring layer 22 through the contact hole 25. In this semiconductor device, after the upper wiring layer 24 is formed, annealing is performed, for example, to form a protective layer on the upper wiring layer 24.

When annealing is performed according to the conventional technique, the lower wiring layer 22 connected to the upper wiring layer 24 through the contact hole 25 thermally expands to push out the upper wiring layer 24 through the contact hole 25 and to thus cause an abnormal geometry such as a projection on the upper wiring layer 24. When the projection or the like extends laterally, lines of the upper wiring layer 24 are connected to each other to result in short-circuiting. Even if the of the lines wiring layer 24 are not connected to each other, a distance between the lines is decreased to form a void in the insulating layer or the like on the wiring layer. When thermal stress acts on the insulating layer having a void, the projection grows to cause interwiring short-circuiting, thus degrading reliability. When the projection or the like extends vertically, flatness of the upper wiring layer 24 is degraded when a wiring layer is to be further formed on the upper wiring layer 24. In addition, the influences of thermal expansion become conspicuous when the area of the lower wiring layer 22 is larger than that of the upper wiring layer 24.

SUMMARY OF THE INVENTION

It is an object of the present invention to provide a semiconductor device wherein an abnormal geometry e.g., a projection on an upper wiring layer which is caused by thermal expansion of a lower wiring layer by the conventional technique described above can be prevented, interwiring short-circuiting can also be prevented, and flatness can be improved.

In order to achieve the above object of the present invention, there is provided a semiconductor device having a multilayered wiring structure, wherein at least one slit is formed around a contact region of a lower wiring layer, and a means is provided for preventing an influence of thermal expansion of a lower wiring layer toward the peripheries of the contact hole by embedding an insulating portion having the same material as an upper insulating layer in the slit.

According to the present invention, since at least one slit is formed around the contact region of the lower wiring layer, and the insulating portion having the same material as that of the upper insulating layer is embedded in the slit is formed integrally with the upper insulating layer, even if the periphery of the contact region of the lower wiring layer thermally expands, the insulating portion in the slit can prevent movement of the lower wiring layer upon its expansion, and thus the influence on the contact hole can be prevented. Therefore, the influence on the upper wiring layer connected to the lower wiring layer through the contact hole formed in the contact region due to the annealing in forming the protect film on the upper wiring layer can be prevented, and an abnormal geometry such as a projection on the upper wiring layer by thermal expansion of the lower wiring layer can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3 to 10 are plan views of semiconductor devices according to other embodiments of the present invention, respectively.

DETAILED DESCRIPTION OF THE PREFERRED EMBODIMENTS

There will now be described an embodiment of this invention with reference to the accompanying drawings.

Semiconductor devices according to embodiments of the present invention will be described with reference to FIGS. 2A to 10. For illustrative convenience, each of the plan views of FIGS. 2B to 10 does not illustrate a substrate 5 and an insulating layer 7 but illustrates a structure cut along the line I—I of FIG. 2A.

Figure 2A:
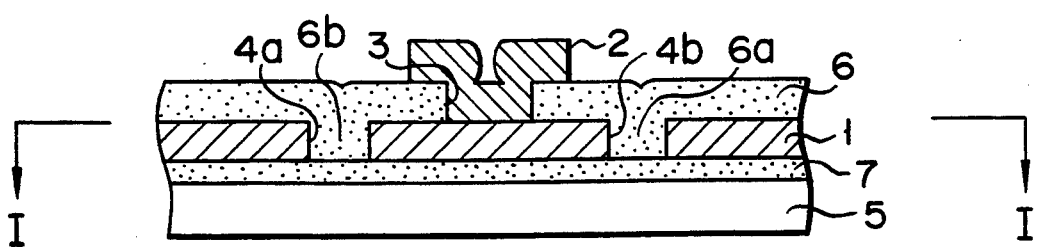
FIG. 2A is a sectional view showing a semiconductor device according to the first embodiment of the present invention cut along the line II—II of FIG. 2B.
Figure 2B:
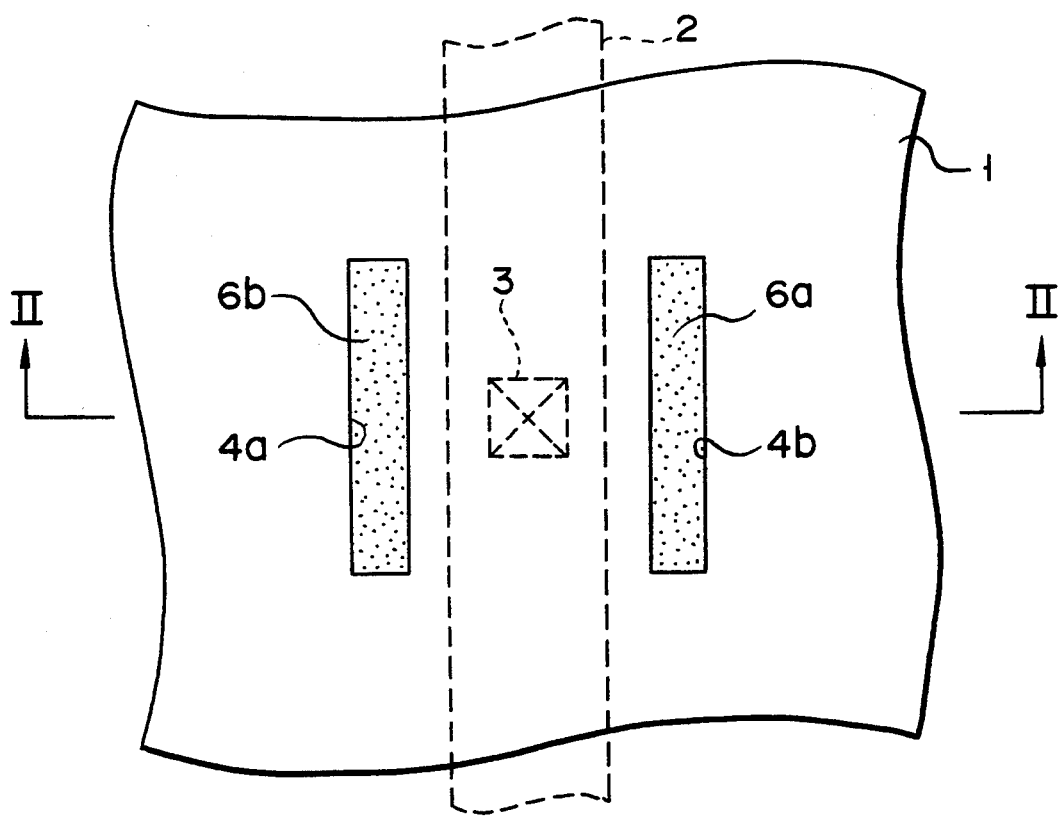
FIG. 2B is a plan view showing the semiconductor device according to the first embodiment of the present invention cut along the line I—I of FIG. 2A.

FIGS. 2A and 2B are a sectional view and a plan view, respectively, showing a semiconductor device according to the first embodiment of the present invention. As shown in FIG. 2A, this semiconductor device comprises the insulating layer 7 formed on the semiconductor substrate 5, a lower wiring layer 1 formed on the insulating layer 7, an insulating layer 6 formed on the lower wiring layer 1 and having a contact hole 3 in a predetermined contact region, and made of a silicon oxide film ($SiO_2$ film) or the like, and an upper wiring layer 2 formed on the insulating layer 6 and connected to the lower wiring layer 1 through the contact hole 3. Slits 4a and 4b are formed around the contact region of the lower wiring layer 1. Insulating portions 6a and 6b are embedded in the slits 4a and 4b and are formed integrally with the insulating layer 6. The insulating layer 6 has rigidity having a predetermined value or more. The "contact region" in the present invention is defined as a region which is located near the contact hole 3 and in contact with the upper wiring layer 2, or located near the upper wiring layer 2 and spaced apart from the contact hole 3 by a predetermined distance.

As shown in FIG. 2B, the length of each of the slits 4a and 4b is larger than the length of one side of the contact hole 3, and the width of each of the slits 4a and 4b is preferably minimized to obtain a minimum wiring pitch due to the following reason. When the width of each of the slits 4a and 4b is large, a current through the contact region is undesirably reduced due to the slits 4a and 4b. In addition, each of the slits 4a and 4b is preferably formed in a region spaced apart from the contact hole 3 by a wiring margin due to the following problem. When the slits 4a and 4b are formed adjacent to the contact hole 3, a problem is posed by mask misalignment at the time of formation of the insulating layer 6. For example, when the width of the contact hole 3 is 1.6 $\mu$m, and its length is 2.5 $\mu$m, slits 4a and 4b each having a width of 2 $\mu$m and a length of 3.7 $\mu$m are respectively formed at both sides of the contact hole 3 at positions spaced apart from the contact hole 3 by 2 $\mu$m each.

In the semiconductor device of FIG. 2B, since the slits 4a and 4b are formed at either side of the contact region of the lower wiring layer 1, positional errors caused by thermal expansion of the lower wiring layer 1 during annealing for forming the protection film on the upper wiring layer 2 can be prevented by the insulating portions 6a and 6b respectively formed in the slits 4a and 4b. For this reason, the influence of annealing on the upper wiring layer 2 connected to the lower wiring layer 1 through the contact hole 3 formed in the contact region can be prevented. Therefore, an abnormal geometry such as a projection formed on the upper wiring layer according to the conventional problem can be minimized, and flatness of the upper wiring layer 2 can be improved. In particular, since the slits 4a and 4b are not formed immediately under the upper wiring layer 2, flatness of the upper wiring layer 2 can be further improved. In addition, in the semiconductor device described above, an influence of thermal expansion of the lower wiring layer 1 on the contact hole 3 in a direction perpendicular to the upper wiring layer 2 can be prevented.

Figure 1:
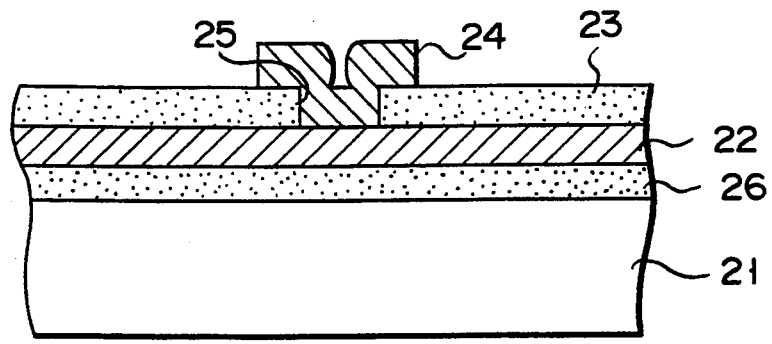
FIG. 1 is a sectional view showing a semiconductor device manufactured by conventional techniques.

FIGS. 3 to 10 are plan views showing semiconductor devices according to the second to ninth embodiments of the present invention, respectively. The reference numerals as in FIG. 1 denote the same parts in FIGS. 3 to 10. In the second to ninth embodiments of the present invention, the positions and shapes of the slits of the first embodiments are changed. The conditions for the slit width, the slit length, the distance from a contact hole 3 to the slit are the same as those of the first embodiment. However, these conditions may be arbitrarily changed. An insulating portion is embedded in each slit of the each of the following embodiments and formed integrally with an insulating layer.

In the second embodiment shown in FIG. 3, two slits 4a and 4b are formed at either side of the contact hole 3 in a direction perpendicular to an upper wiring layer 2. In the semiconductor device of this embodiment, the same effect as in the first embodiment can be obtained, and an influence of thermal expansion of a lower wiring layer 1 on the contact hole 3 in a direction parallel to the upper wiring layer 2 can be prevented.

In the third embodiment shown in FIG. 4, a contact region is formed at a side edge of a lower wiring layer 1. In this case, two slits need not be formed at both sides of the contact hole 3. More specifically, only one slit 4a is formed in a region opposite to the side edge with respect to the contact hole 3. The same effect as in the second embodiment can be obtained in the semiconductor device of the third embodiment.

Figure 5:
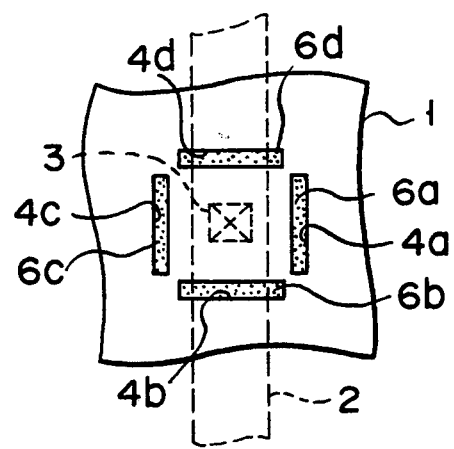

In the fourth embodiment shown in FIG. 5, four slits 4a to 4d are formed to surround the contact hole 3 along the four sides of the contact hole 3. The slits 4a and 4c extend parallel to each other along an upper wiring layer 2, and the slits 4b and 4d extend parallel to each other in a direction perpendicular to the upper wiring layer 2. In the semiconductor device of this embodiment, influences of thermal expansion of a lower wiring layer 1 on the contact hole 3 in the direction perpendicular to the upper wiring layer and in the direction parallel to the lower wiring layer 1 can be prevented.

Figure 6:
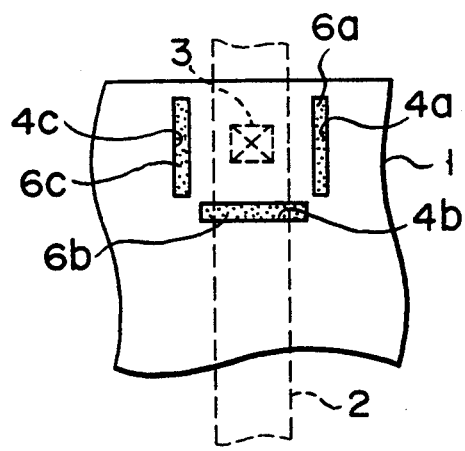

In the fifth embodiment shown in FIG. 6, a contact region is formed at a side edge of a lower wiring layer 1 in the same manner as in the third embodiment. In this case, the slits need not be formed near the side edge of the contact hole 3. More specifically, slits 4a and 4c are formed at both sides of the contact hole 3 in a direction parallel to an upper wiring layer 2, and one slit 4b is formed in a region opposite to the side edge with respect to the contact hole 3 in a direction perpendicular to the upper wiring layer 2. The same effect as in the fourth embodiment can be obtained in the semiconductor device of the fifth embodiment.

Figure 7:
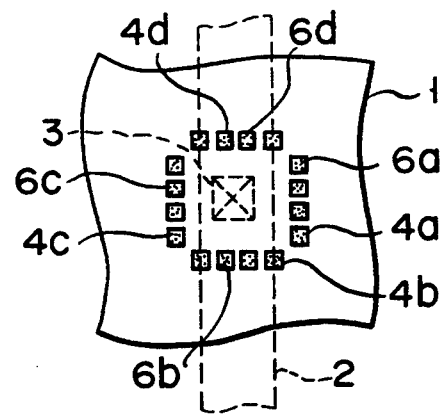

In the sixth embodiment shown in FIG. 7, slits 4a to 4d are formed to surround the contact hole 3. Unlike the fourth embodiment, each of the four slits formed along four sides of the contact hole 3 is divided into a plurality of pieces. Insulating portions 6a to 6d are formed in the plurality of slit pieces. The same effect as in the fourth embodiment can be obtained in the semiconductor device of the sixth embodiment. In addition, a decrease in current flowing through the lower wiring layer 1 can be reduced.

Figure 8:
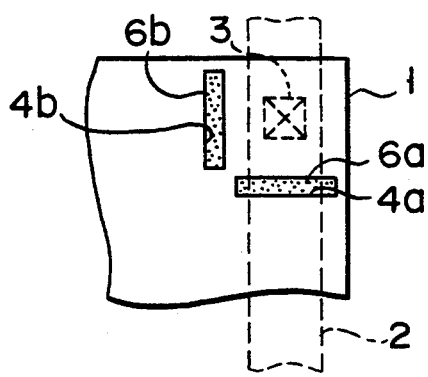

In the seventh embodiment shown in FIG. 8, a contact region is formed at a corner of a lower wiring layer 1. In this case, two slits 4a and 4b are formed in a region opposite to one side edge with respect to the contact hole 3 in a direction parallel to the upper wiring layer 2 and in a region opposite to the other side edge with respect to the contact hole 3 in a direction perpendicular to the upper wiring layer 2, respectively. The same effect as in the fourth embodiment can be obtained in the semiconductor device of the seventh embodiment.

Figure 9:
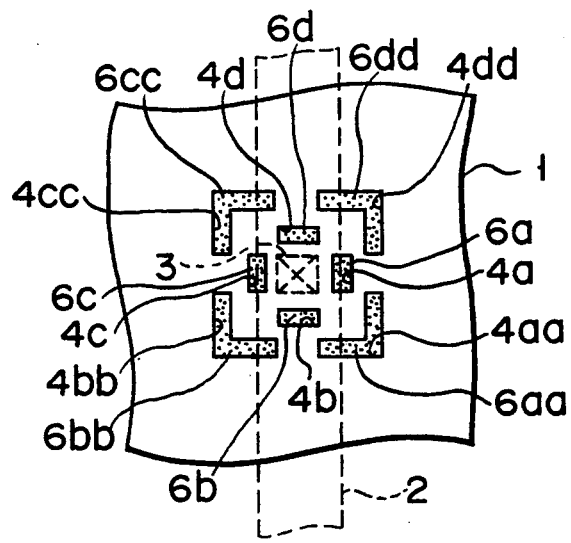

The eighth embodiment shown in FIG. 9 exemplifies an important structure in practical applications. Four slits 4a to 4d are formed to surround the contact hole 3 along the four sides of the contact hole 3. In addition, four L-shaped slits 4aa to 4dd are formed at four corners of the contact hole 3 so as to surround the four slits 4a to 4d in a staggered manner. The same effect as in the fourth embodiment can be obtained in the semiconductor device of the eighth embodiment. An influence of thermal expansion of a lower wiring layer 1 on the upper wiring layer 2 contacting the lower wiring layer 1 through the contact hole 3 can be completely prevented.

Figure 10:
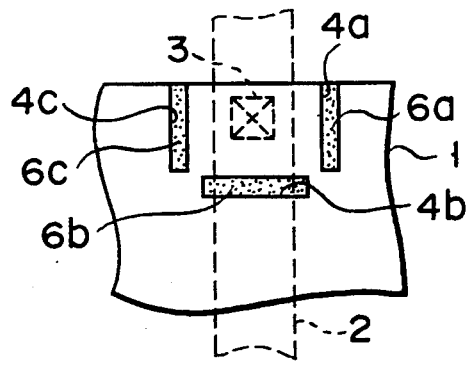

In the ninth embodiment shown in FIG. 10, a contact region is formed at a side edge of a lower wiring layer 1 as in the fifth embodiment. In this case, three slits 4a to 4c are formed in three regions, respectively, as in the fifth embodiment. However, in the ninth embodiment, two slits 4a and 4c formed at both sides of the contact hole 3 in a direction parallel to the upper wiring layer 2 are not separated from the side edge of the lower wiring layer 1 but are in contact therewith. The same effect as in the fourth embodiment can be obtained in the semiconductor device of the ninth embodiment.

According to the present invention as has been described above, at least one slit is formed around a contact region of a lower wiring layer 1, and an insulating portion having the same material as that of the insulating layer 6 is embedded to form a rectangular projecting portion, thereby preventing the periphery of the contact region of the lower wiring layer 1 from being moved by thermal expansion. Therefore, the influence of thermal expansion of the lower wiring layer 1 on the upper wiring layer 2 connected to the lower wiring layer 1 through the contact hole 3 formed in the contact region can be prevented. There is therefore provided a semiconductor device capable of preventing an abnormal geometry such as a projection on the upper wiring layer 2 and thus improving flatness of the upper wiring layer 2 and further preventing a short-circuit between the wiring layers.

Additional advantages and modifications will readily occur to those skilled in the art. Therefore, the invention in its broader aspects is not limited to the specific details, representative devices, and illustrated examples shown and described. Accordingly, departures may be made from such details without departing from the spirit or scope of the general inventive concept as defined by the appended claims and their equivalents.

What is claimed is:

1. A semiconductor device having a multilayered wiring structure comprising: a
   substrate;
   a lower wiring layer formed above the substrate and having a contact region thereon and at least one slit extending around the contact region;
   an insulating layer formed on the lower wiring layer and in the at least one slit and having a contact hole at a position corresponding to the contact region; and
   an upper wiring layer formed on the insulating layer and in the contact hole.

2. A device according to claim 1, wherein the width of the at least one slit is less than a width of the upper wiring layer.

3. A device according to claim 1, wherein the length of the at least one slit is not less than a length of one side of the contact hole.

4. A device according to claim 1, wherein the at least one slit is spaced apart from the contact region by a distance less than the width of the at least one slit.

5. A device according to claim 1, wherein the at least one slit comprises a slit positioned in a direction parallel to the width of the upper wiring layer.

6. A device according to claim 1, wherein the at least one slit comprises a slit positioned in a direction perpendicular to the upper wiring layer.

7. A device according to claim 1, wherein the at least one slit is positioned in a direction parallel to the width of the upper wiring layer and further includes at least a second slit positioned in a direction perpendicular to the width of the upper wiring layer.

8. A device according to claim 1, which further includes a plurality of slits in addition to the at least one slit and the plurality of slits being arranged adjacent the contact region at different distances from the contact region.

9. A device according to claim 8, wherein outer most slits of the plurality of slits comprise L-shaped slits.

10. A device according to claim 1, wherein the at least one slit is divided into a plurality of slit pieces.

11. A device according to claim 1, wherein the insulating layer is integrally formed on the lower wiring layer and in the at least one slit for providing rigidity to the device.

12. A device according to claim 1, wherein the length of the at least one slit is substantially equal to the width of the upper wiring layer.

13. A device according to claim 1, wherein the length of the at least one slit is identical to a dimension of one side of the contact hole.

14. A semiconductor device having a multilayered wiring structure comprising:
    an insulating layer having a first surface, a second surface, and a contact hole penetrating therethrough; and
    first and second wirings sandwiching the insulating layer and electrically connected through the contact hole,
    wherein one of the first and second wirings has at least one slit extending around the contact hole and filled with insulating material.

15. A device according to claim 14, wherein the width of the at least one slit is less than a width of the upper wiring layer.

16. A device according to claim 14, wherein the length of the at least one slit is not less than a length of one side of the contact hole.

17. A device according to claim 14, wherein the at least one slit is spaced apart from the contact region by a distance less than the width of the at least one slit.

18. A device according to claim 14, wherein the at least one slit comprises a slit positioned in a direction parallel to the width of the upper wiring layer.

19. A device according to claim 14, wherein the at least one slit comprises a slit positioned in a direction perpendicular to the upper wiring layer.

20. A device according to claim 14, wherein the at least one slit is positioned in a direction parallel to the width of the upper wiring layer and further includes at least a second slit positioned in a direction perpendicular to the width of the upper wiring layer.

21. A device according to claim 14, which further includes a plurality of slits in addition to the at least one slit and the plurality of slits being arranged adjacent the contact region at different distances from the contact region.

22. A device according to claim 21, wherein outer most slits of the plurality of slits comprise L-shaped slits.

23. A device according to claim 14, wherein the at least one slit is divided into a plurality of slit pieces.

24. A device according to claim 14, wherein the insulating layer is integrally formed on the lower wiring layer and in the at least one slit for providing rigidity to the device.

25. A device according to claim 14, wherein the length of the at least one slit is substantially equal to the width of the upper wiring layer.

26. A device according to claim 14, wherein the length of the at least one slit is identical to a dimension of one side of the contact hole.

* * * * *